(12) United States Patent
Moosburger et al.

(10) Patent No.: US 8,878,227 B2
(45) Date of Patent: Nov. 4, 2014

(54) OPTOELECTRONIC SEMICONDUCTOR CHIP AND METHOD FOR PRODUCING OPTOELECTRONIC SEMICONDUCTOR CHIPS

(75) Inventors: Jürgen Moosburger, Regensburg (DE); Christoph Neureuther, Quarry Bay (HK); Norwin von Malm, Nittendorf-Thumhausen (DE)

(73) Assignee: OSRAM Opto Semiconductors GmbH (DE)

( * ) Notice: Subject to any disclaimer, the term of this patent is extended or adjusted under 35 U.S.C. 154(b) by 53 days.

(21) Appl. No.: 13/817,210

(22) PCT Filed: Aug. 9, 2011

(86) PCT No.: PCT/EP2011/063715
§ 371 (c)(1),
(2), (4) Date: Apr. 2, 2013

(87) PCT Pub. No.: WO2012/022657
PCT Pub. Date: Feb. 23, 2012

(65) Prior Publication Data
US 2013/0207156 A1 Aug. 15, 2013

(30) Foreign Application Priority Data
Aug. 18, 2010 (DE) .......................... 10 2010 034 665

(51) Int. Cl.
*H01L 33/62* (2010.01)
*H01L 27/15* (2006.01)
*H01L 31/153* (2006.01)
H01L 33/00 (2010.01)
H01L 33/38 (2010.01)

(52) U.S. Cl.
CPC ................ *H01L 33/62* (2013.01); *H01L 27/15* (2013.01); *H01L 31/153* (2013.01); H01L 33/0079 (2013.01); H01L 2924/0002 (2013.01); H01L 33/382 (2013.01)
USPC .............................................. 257/99; 438/33

(58) Field of Classification Search
CPC ....................................................... H01I 29/10
See application file for complete search history.

(56) References Cited

U.S. PATENT DOCUMENTS 6,031,251 A 2/2000 Gempe et al.
7,892,870 B2 * 2/2011 Shi .................................. 438/30
(Continued)

FOREIGN PATENT DOCUMENTS

DE 10 2007 022 947 A1 10/2008
DE 10 2009 006 250 A1 10/2009
DE 10 2009 006 177 A1 6/2010
(Continued)

OTHER PUBLICATIONS

Schnitzer, I. eta l., "*30% External Quantum Efficiency from Surface Textured, Thin-Film Light-Emitting Diodes,*" Appl. Phys. Lett. 63(16), Oct. 18, 1993, pp. 2174-2176.

*Primary Examiner* — Fernando L Toledo
*Assistant Examiner* — Valerie N Newton
(74) *Attorney, Agent, or Firm* — DLA Piper LLP (US)

(57) ABSTRACT

An optoelectronic semiconductor chip includes a carrier and a semiconductor body having a semiconductor layer sequence, the semiconductor body arranged on the carrier wherein an emission region and a detection region are formed in the semiconductor body having the semiconductor layer sequence; the semiconductor layer sequence includes an active region arranged between a first semiconductor layer and a second semiconductor layer and provided in the emission region to generate radiation; the first semiconductor layer is arranged on the side of the active region facing away from the carrier; and the emission region has a recess extending through the active region.

19 Claims, 7 Drawing Sheets

(56) References Cited

U.S. PATENT DOCUMENTS

| | | |
|---|---|---|
| 2006/0181828 A1 | 8/2006 | Sato et al. |
| 2010/0001300 A1 | 1/2010 | Raring et al. |
| 2010/0171135 A1 | 7/2010 | Engl et al. |
| 2011/0260205 A1 | 10/2011 | Moosburger et al. |
| 2012/0018764 A1 | 1/2012 | Choi et al. |

FOREIGN PATENT DOCUMENTS

| | | |
|---|---|---|
| JP | 58-204574 | 11/1983 |
| WO | 2010/056083 A2 | 5/2010 |

* cited by examiner

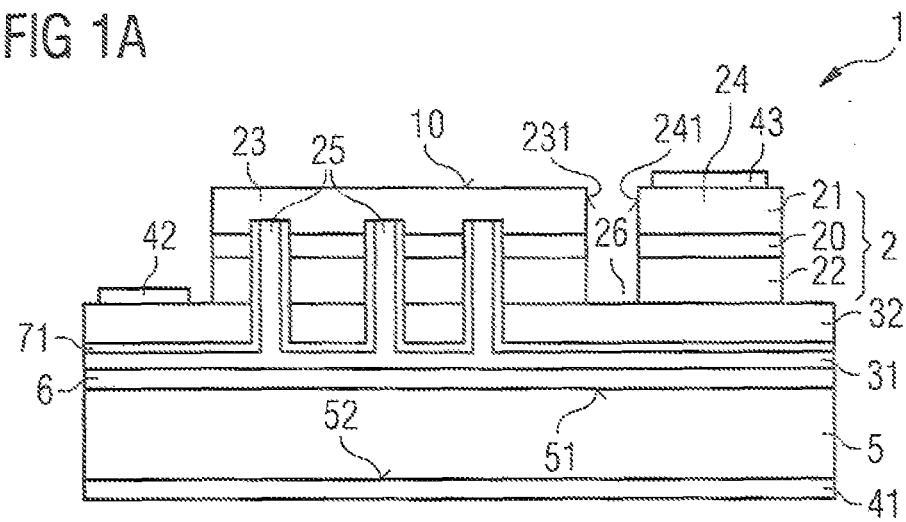
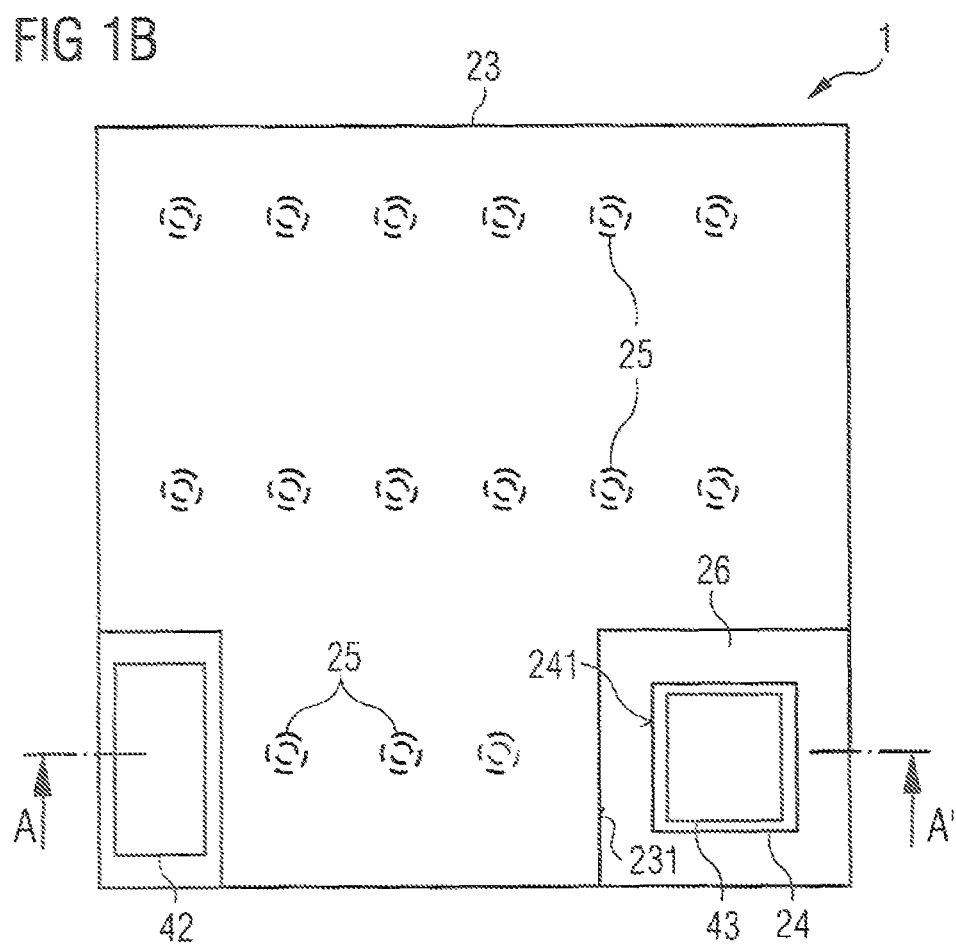

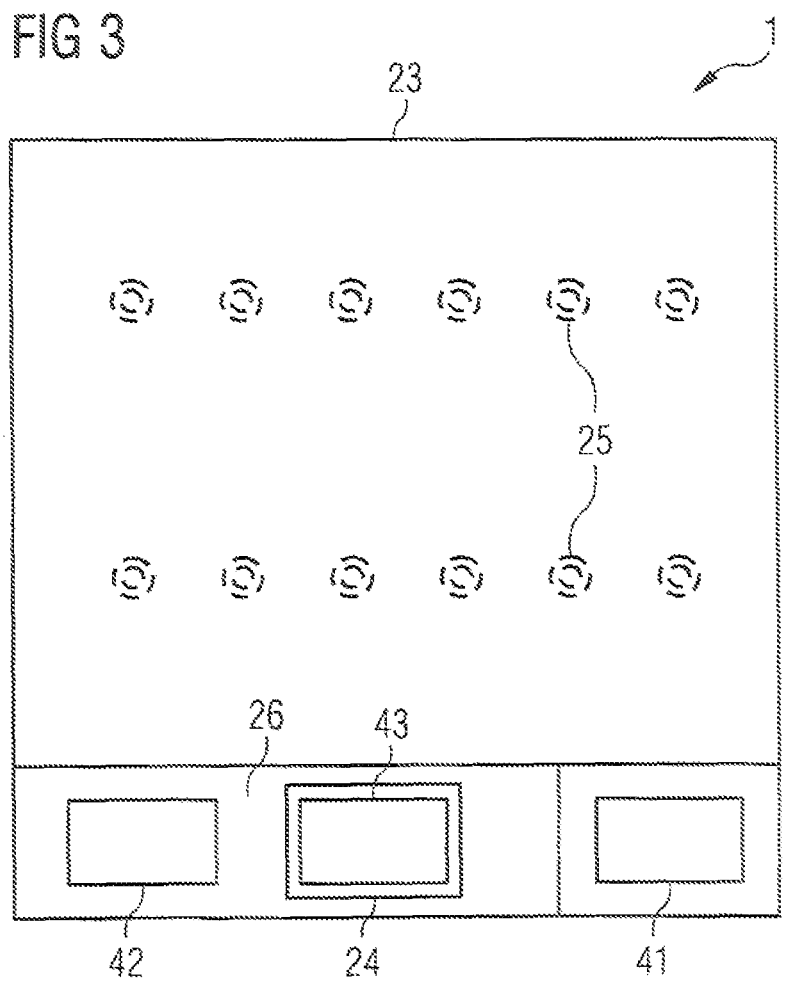

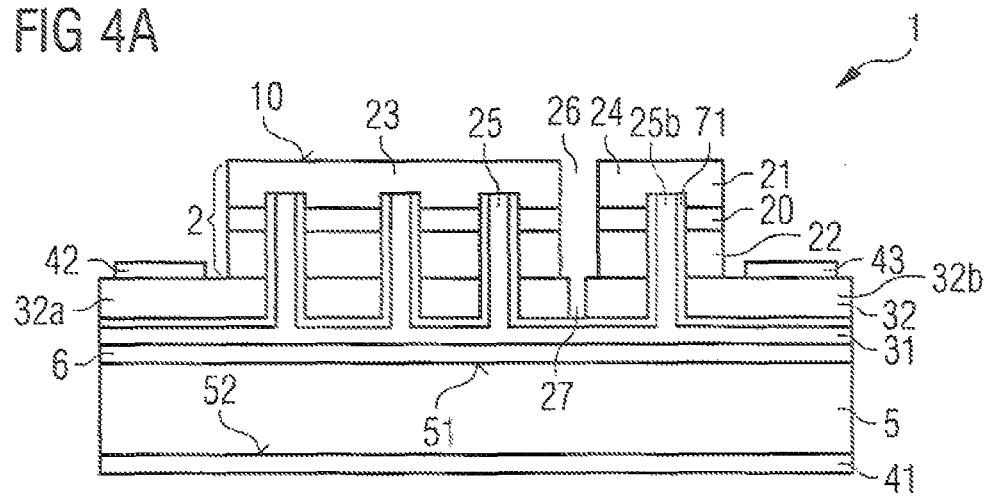
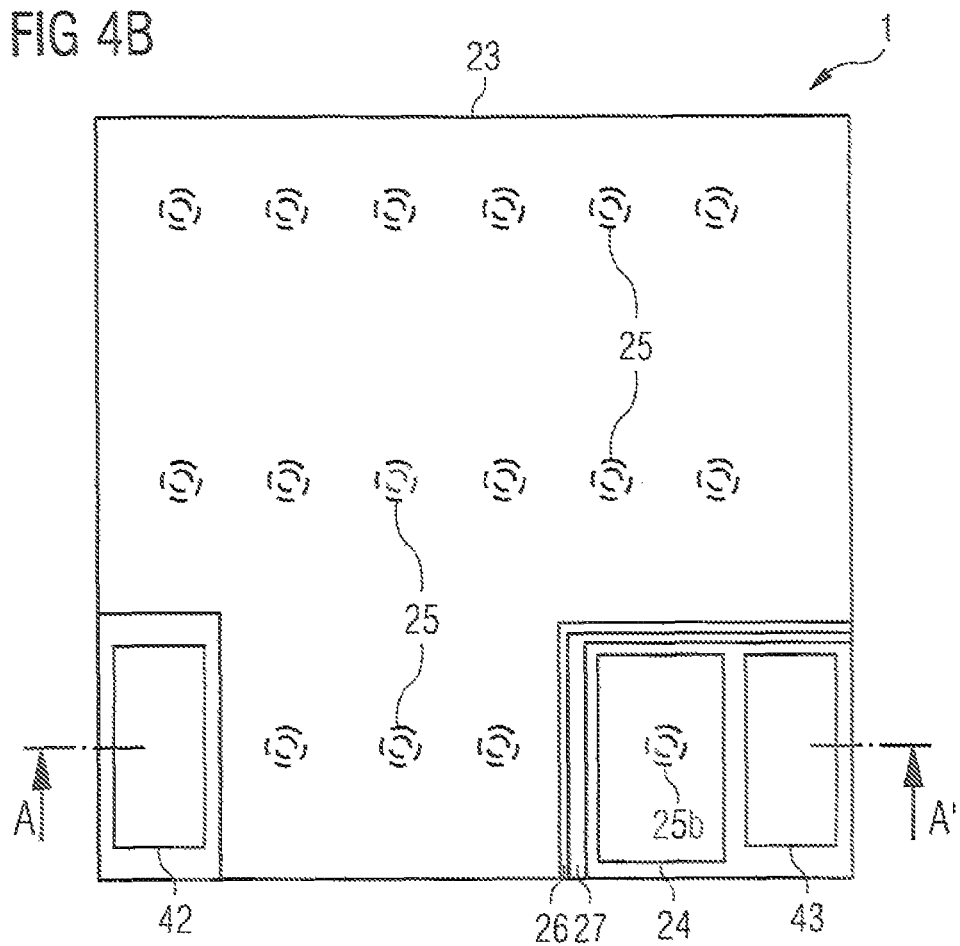

OPTOELECTRONIC SEMICONDUCTOR CHIP AND METHOD FOR PRODUCING OPTOELECTRONIC SEMICONDUCTOR CHIPS

RELATED APPLICATIONS

This is a §371 of International Application No. PCT/EP2011/063244, with an international filing date of Aug. 1, 2011 (WO 2012/013822 A1, published Feb. 2, 2012), which is based on German Patent Application No. 10 2010 032 834.0 filed Jul. 30, 2010, the subject matter of which is incorporated herein by reference.

This is a §371 of International Application No. PCT/EP2011/063715, with an international filing date of Aug. 9, 2011 (WO 2012/022657 A1, published Feb. 25, 2012), which is based on German Patent Application No. 10 2010 034 665.9 filed Aug. 18, 2010, the subject matter of which is incorporated herein by reference.

TECHNICAL FIELD

This disclosure relates to an optoelectronic semiconductor chip and a method for producing optoelectronic semiconductor chips.

BACKGROUND

In the case of optoelectronic components such as light emitting diodes, aging effects, for example, aging of the semiconductor chip or the luminescence convertor material can lead to a change in the emission characteristic, for example, to a reduced radiation power and/or a change in the color locus. To compensate for such effects, in an arrangement of light emitting diodes a photodiode can additionally be used, the signal of which is fed to a closed-loop control for the operating parameters of the light emitting diodes. Precisely in the case of an arrangement comprising many light emitting diodes, however, a photodiode cannot monitor the output signal of each individual light emitting diode, or can do so only with high outlay.

It could therefore be helpful to provide an optoelectronic semiconductor chip with which increased reliability and constancy of the emission can be obtained. Furthermore, it could be helpful to provide a method by which such an optoelectronic semiconductor chip can be reliably produced in a simple manner.

SUMMARY

We provide an optoelectronic semiconductor chip including a carrier and a semiconductor body having a semiconductor layer sequence, said semiconductor body being arranged on the carrier wherein an emission region and a detection region are formed in the semiconductor body having the semiconductor layer sequence; the semiconductor layer sequence includes an active region arranged between a first semiconductor layer and a second semiconductor layer and provided in the emission region to generate radiation; the first semiconductor layer is arranged on the side of the active region facing away from the carrier; the emission region has a recess extending through the active region; the first semiconductor layer electrically conductively connects to a first contact in the emission region via a first connection layer wherein the first connection layer extends in the recess from the first semiconductor layer in the direction of the carrier; the second semiconductor layer electrically conductively connects to a second contact via a second connection layer; and the detection region electrically conductively connects to an additional contact.

We also provide a method for producing a plurality of optoelectric semiconductor chips including a) providing a semiconductor layer sequence including an active region arranged between a first semiconductor layer and a second semiconductor layer; b) forming a plurality of recesses extending through the second semiconductor layer and through the active region; c) forming a first connection layer on the semiconductor layer sequence, wherein the first connection layer electrically conductively connects to the first semiconductor layer in the recesses; d) forming a composite assembly comprising the semiconductor layer sequence and a carrier; e) forming a plurality of emission regions and a plurality of detection regions from the semiconductor layer sequence, wherein the emission regions each have at least one recess and the detection regions are each provided with an additional contact electrically insulated from the emission regions; and f) singulating the composite assembly into a plurality of semiconductor chips, wherein each semiconductor chip includes at least one emission region and at least one detection region.

BRIEF DESCRIPTION OF THE DRAWINGS

FIGS. 1A and 1B show a first example of an optoelectronic semiconductor chip in schematic plan view (FIG. 1B) and associated sectional view (FIG. 1A).

FIG. 3 shows a third example of an optoelectronic semiconductor chip in schematic plan view.

FIGS. 4A and 4B show a fourth example of an optoelectronic semiconductor chip in schematic plan view (FIG. 4B) and associated sectional view (FIG. 4A).

Figure 2A:
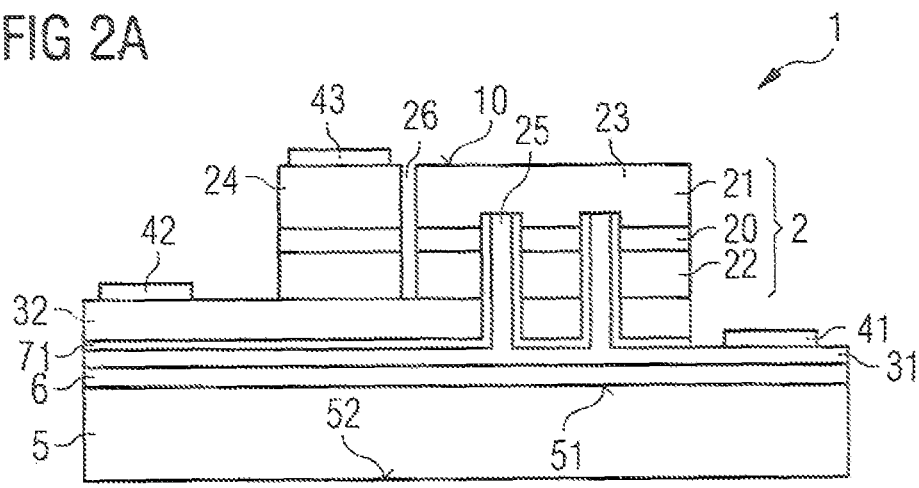
FIGS. 2A and 2B show a second example of an optoelectronic semiconductor chip in schematic plan view (FIG. 2B) and associated sectional view (FIG. 2A).

We provide an optoelectronic semiconductor chip which may comprise a carrier and a semiconductor body having a semiconductor layer sequence, the semiconductor body arranged on the carrier. An emission region and a detection region may be formed in the semiconductor body having the semiconductor layer sequence. The semiconductor layer sequence may comprise an active region arranged between a first semiconductor layer and a second semiconductor layer. The active region may be provided in the emission region to generate radiation. The first semiconductor layer may be arranged on that side of the active region which faces away from the carrier. The emission region may have a recess extending through the active region. The first semiconductor layer may be electrically conductively connected to a first contact in the emission region via a first connection layer, wherein the first connection layer extends in the recess from the first semiconductor layer in the direction of the carrier. The second semiconductor layer may be electrically conductively connected to a second contact. The detection region may be electrically conductively connected to an additional contact.

In contrast to the first and second contacts, the additional contact is not provided to inject charge carriers into the emission region. By the additional contact, a signal generated in the active region of the detection region during the operation of the semiconductor chip is externally accessible. In other words, the detection region fulfills the function of a photodiode integrated into the semiconductor chip. The emission behavior of the emission region can be monitored with the detection region. A separate, external photodiode spaced apart from the semiconductor chip for monitoring purposes can be dispensed with.

Compared with an external photodiode, the detection region can be arranged very close to the emission region. Preferably, a distance between the detection region and the emission region is at most 50 µm, particularly preferably at most 20 µm.

During production, the detection region and the emission region can emerge from the same semiconductor layer sequence. It is not necessary to deposit additional layers to form the detection region. The active region of the emission region and the active region of the detection region can have the same material composition.

The first contact, the second contact and the additional contact are understood to mean in each case areas provided for external electrical contact-connection of the semiconductor chip. The contacts in each case constitute an externally accessible area. The contacts can, in particular, in each case be formed as separate layers or be embodied as a surface of one of the connection layers or of the semiconductor body.

Expediently, the active region of the emission region and the active region of the detection region are electrically insulated from one another.

Furthermore, the emission region and the detection region are arranged alongside one another preferably in a lateral direction, that is to say along a main extension plane of the semiconductor layers of the semiconductor body. Preferably, an interspace is formed between the emission and detection regions, which interspace divides the semiconductor body, in particular the active region, into two separate regions laterally separated from one another.

Preferably, the semiconductor body cohesively connects to the carrier. The carrier is, in particular, different than a growth substrate for the semiconductor layer sequence of the semiconductor body.

In the case of a cohesive connection, the connection partners, which are preferably prefabricated, are held together by atomic and/or molecular forces. A cohesive connection can be obtained, for example, by a joining layer for instance an adhesive layer or a solder layer. In general, separation of the connection is accompanied by destruction of the joining layer and/or at least one of the connection partners.

Preferably, the first connection layer runs regionally between the semiconductor body and the carrier. In a plan view of the semiconductor chip, the first connection layer can completely or at least substantially completely cover the carrier. A structuring of the first connection layer can be dispensed with during production.

With further preference, the second connection layer runs regionally between the emission region and the first connection layer. By the first and second connection layers, electrical contact can be made with the first semiconductor layer and the second semiconductor layer, respectively, in the emission region from the side facing the carrier. A radiation exit area of the emission region facing away from the carrier can be embodied in a manner free of an external electrical contact.

Preferably, either the first contact or the second contact electrically conductively connects to the detection region. Together with the additional contact, the detection region is therefore externally accessible by two contacts. A further contact electrically insulated from the emission region can be dispensed with. The common contact for the emission and detection regions can constitute a ground contact, in particular, during operation of the semiconductor chip.

As an alternative to a common contact, however, it is also possible to provide a further additional contact such that the detection region can be externally electrically contact-connected completely separately from the emission region.

The second contact may form a common contact for the emission and detection regions. In particular, the second connection layer can electrically conductively connect to the second semiconductor layer in the detection region.

The first contact may form a common contact for the emission and detection regions. In this case, the first contact can electrically conductively connect either to the first semiconductor layer or to the second semiconductor layer in the detection region.

Preferably, a connection window is formed in the second connection layer, wherein the first connection layer connects to the second semiconductor layer through the connection window in the detection region. In this case, therefore, the first connection layer electrically conductively connects to the first semiconductor layer in the emission region and to the second semiconductor layer in the detection region.

In this case, the second connection layer is expediently electrically insulated from the second semiconductor layer. For the purpose of electrical insulation, the connection window can project beyond the detection region in a plan view of the semiconductor chip. Alternatively or supplementarily, an insulation layer can be provided between the second connection layer and the detection region.

The additional contact may be arranged in the detection region on the first semiconductor layer. In other words, the additional contact may cover the detection region at least regionally in a plan view of the semiconductor chip. The contact-connection by the additional contact may be effected within the detection region in a plan view of the semiconductor chip. A more extensive reduction of the area of the emission region that can be utilized to generate radiation is not necessary for formation of the additional contact. Furthermore, the additional contact can reduce that signal component brought about in the detection region by radiation emitted and/or reflected outside the semiconductor chip and would impinge perpendicularly or substantially perpendicularly on the active region of the detection region.

Alternatively, the detection region has an additional recess, wherein the first connection layer extends in the additional recess from the first semiconductor layer in the further recess in the direction of the carrier. By the additional recess, electrical contact can be made with the first semiconductor layer in the detection region from that side of the semiconductor body which faces the carrier.

In particular, the first semiconductor layer in the emission region and the first semiconductor layer in the detection region can electrically conductively connect to the first contact as common contact by the recess and the further recess, respectively.

Preferably, the second connection layer is subdivided by a cutout into at least two partial regions electrically insulated from one another. Preferably, a first partial region electrically conductively connects to the emission region and a second partial region is electrically conductively connects to the detection region.

In a plan view of the semiconductor chip, the additional contact and the detection region can be arranged alongside one another. With further preference, the detection region and the additional contact are arranged on the second partial region of the second connection layer in a plan view of the semiconductor chip.

In a method for producing a plurality of optoelectronic semiconductor chips, a semiconductor layer sequence may be provided comprising an active region arranged between a first semiconductor layer and a second semiconductor layer. A plurality of recesses extending through the second semiconductor layer and through the active region are formed. A first connection layer is formed on the semiconductor layer sequence, wherein the first connection layer electrically conductively connects to the first semiconductor layer in the recesses. A composite assembly comprising the semiconductor layer sequence and a carrier is formed. A plurality of emission regions and a plurality of detection regions are formed from the semiconductor layer sequence, wherein the emission regions in each case have at least one recess and the detection regions are in each case provided with an additional contact electrically insulated from the emission regions. The composite assembly is singulated into a plurality of semiconductor chips, wherein each semiconductor chip comprises at least one emission region and at least one detection region.

In this case, the individual method steps need not necessarily be carried out in the order of the above enumeration.

Preferably, in particular before the composite assembly is singulated, a growth substrate for the semiconductor layer sequence is removed at least regionally. As early as before the singulation, therefore, a detection region can in each case be integrated into the semiconductor chips.

A semiconductor chip in which the growth substrate is removed is also designated as a thin-film semiconductor chip.

Our thin-film semiconductor chip, for instance a thin-film light emitting diode chip, is distinguished, in particular, by the following characteristic features:
  a reflective layer is applied or formed at a first main area—facing toward a carrier element, for instance the carrier—of a radiation-generating epitaxial layer sequence, the reflective layer reflecting at least part of the electromagnetic radiation generated in the epitaxial layer sequence back into the latter;
  the epitaxial layer sequence has a thickness of 20 μm or less, in particular about 10 μm; and
  the epitaxial layer sequence contains at least one semiconductor layer with at least one area having an intermixing structure which ideally leads to an approximately ergodic distribution of the light in the epitaxial layer sequence, that is to say that it has an as far as possible ergodically stochastic scattering behavior.

A basic principle of a thin-film light emitting diode chip is described, for example, in I. Schnitzer et al., Appl. Phys. Lett. 63 (16), Oct. 18, 1993, 2174-2176, the subject matter of which is hereby incorporated by reference.

A thin-film light emitting diode chip is to a good approximation a Lambertian surface emitter and is therefore particularly well suited to application in a headlight.

The method described is particularly suitable for producing a semiconductor chip described further above. Therefore, features mentioned in connection with the semiconductor chip can also be used for the method, and vice versa.

Further features, configurations and expediencies will become apparent from the following description of selected examples in conjunction with the drawings.

Elements that are identical, of identical type or act identically are provided with identical reference signs in the figures.

The figures and the size relationships of the elements illustrated in the figures among one another should not be regarded as to scale. Rather, individual elements and, in particular, layer thicknesses may be illustrated with an exaggerated size to enable better illustration and/or to afford a better understanding.

A first example of an optoelectronic semiconductor chip is illustrated in schematic plan view in FIG. 1B and in associated schematic sectional view along the line AA' in FIG. 1A.

The semiconductor chip 1 comprises a semiconductor body 2 having a semiconductor layer sequence. The semiconductor body is fixed to a first main area 51 of a carrier 5 by a joining layer 6, for instance an adhesive layer or a solder layer. The semiconductor body 2 has an emission region 23 and a detection region 24. The emission region and the detection region are arranged alongside one another in a manner free of overlap in a plan view of the semiconductor chip. The emission region and the detection region emerge from the same semiconductor layer sequence and have the same material composition. The semiconductor layer sequence forming the semiconductor body 2 is preferably deposited epitaxially, for instance by MBE or MOVPE. The semiconductor layer sequence comprises an active region 20 arranged between a first semiconductor layer 21 and a second semiconductor layer 22. The first semiconductor layer is arranged on that side of the active region facing away from the carrier 5. The active region is provided to generate radiation in the emission region and detect radiation in the detection region.

A radiation exit area 10 of the semiconductor chip 1 in particular of the emission region 23, is formed on that side of the semiconductor body 2 facing away from the carrier 5. Radiation generated in the active region of the emission region during operation of the semiconductor chip preferably predominantly emerges from the semiconductor chip 1 through the radiation exit area. To increase coupling-out efficiency, the radiation exit area 10 in the emission region, can be provided with a roughening (not explicitly illustrated). For simplified contact-connection, the detection region can be omitted from the roughening such that the detection region provides a smooth surface for electrical contact-connection.

The first semiconductor layer 21 is different from the second semiconductor layer 22 with regard to the conduction type. By way of example, the second semiconductor layer can be embodied in p-conducting fashion and the first semiconductor layer in n-conducting fashion, or vice versa. The active region 20 is therefore arranged in a diode structure.

The emission region 23 and the detection region 24 are separated from one another by an interspace 26. The interspace 26 extends completely through the semiconductor body 2 in a vertical direction, that is to say in a direction perpendicular to a main extension plane of the semiconductor layers of the semiconductor body 2. An electrical insulation of the detection region from the emission region is thus realized in a simple manner.

A first connection layer 31 is formed between the semiconductor body 2 and the carrier 5. In the emission region 23, the semiconductor body 2 has a plurality of recesses 25 extending through the second semiconductor layer 22 and through the active region 20 into the first semiconductor layer 21. The first connection layer 31 runs through the recesses and produces an electrically conductive connection to the first semiconductor layer 21 from that side of the semiconductor body 2 facing the carrier.

A first contact 41 is formed on a second main area 52 of the carrier 5 situated opposite the first main area 51, the first contact electrically conductively connected to the first connection layer via the carrier 5 and the joining layer 6.

A second connection layer 32 is formed between the semiconductor body 2 and the carrier 5, in particular between the semiconductor body and the first connection layer 31. The second connection layer 32 electrically conductively connects to a second contact 42. The second contact electrically conductively connects via the second connection layer 32 to the second semiconductor layer 22 in the emission region 23 and in the detection region 24 and thus forms a common contact for the emission and detection regions.

During operation of the semiconductor chip 1, via the contacts 41, 42, charge carriers can be injected from different sides into the active region 20 of the emission region 23 and recombine there with emission of radiation.

An insulation layer 71 is formed between the first connection layer 31 and the second connection layer 32. The insulation layer prevents an electrical connection between the first connection layer and the second connection layer and between the first connection layer and the second semiconductor layer 22.

In the detection region 24, the first semiconductor layer 21 electrically connects to an additional contact 43. Between the second contact 42 and the additional contact 43, a signal generated in the active region 20 of the detection region can be tapped off during operation. The detection region 24 can therefore be operated independently of the emission region. The signal is predominantly generated by radiation impinging through a side area 241 (of the detection region, in particular by radiation generated in the active region 23 of the emission region and emerges through a side area 231 of the emission region. The influence of extraneous radiation, that is to say of radiation not generated by the semiconductor chip 1, is thus reduced, in particular in comparison to an arrangement comprising a detector arranged separately from the semiconductor chip.

The signal generated in the detection region 24 is therefore particularly suitable for monitoring or closed-loop control of the emission region 23. Therefore, when such a semiconductor chip is used in a semiconductor component comprising one or a plurality of such semiconductor chips 1, no additional external photodiode is necessary. By comparison to an external photodiode, the described integrated photodiode in the form of the detection region is distinguished by a particularly small distance, which furthermore is already defined during production. The distance is preferably 50 µm or less, particularly preferably 20 µm or less. The influence of extraneous radiation is thus reduced more extensively.

In the case of an encapsulation of the semiconductor chip 1, the interspace 26 can be completely filled with the encapsulation material. The radiation path between the emission region 23 and the detection region 24 runs within the encapsulation. The risk of degradation of the signal generated in the detection region on account of contamination is reduced in comparison to an arrangement comprising a separate photodiode spaced apart from the semiconductor chip.

Furthermore, an arrangement comprising a plurality of semiconductor chips 1 has a number of detection regions that increases proportionally with the number of emission regions 23 such that reliable monitoring or closed-loop control of the individual emission regions can be obtained in a simplified manner.

The plurality of recesses 25 serve to inject charge carriers uniformly in a lateral direction into the active region 20 via the first semiconductor layer 21. The recesses 25 can be arranged, for example, in a matrix-like manner or in the form of a honeycomb pattern. Particularly in the case of sufficiently high transverse conductivity of the first semiconductor layer 21, a construction of the semiconductor chip is also possible which has in the emission region only a single recess 25 to make electrical contact with the first semiconductor layer 21.

In a plan view of the semiconductor chip 1, the area of the detection region 24 is preferably small relative to the area of the emission region 23. Preferably, the area of the detection region is at most 20%, particularly preferably at most 10%, of the area of the semiconductor chip 1. The smaller the area proportion of the detection region, the lower the losses—caused by the integration of a detection region—of the area which can be utilized for the emission region 24 for generating radiation.

During operation of the semiconductor chip 1, the electrical voltages between the first contact 41 and the second contact 42, and respectively between the additional contact 43 and the second contact 42, can be set independently of one another. This is expediently done such that the emission region operates in the forward direction and at the same time the detection region operates in a manner free of voltage or in the reverse direction.

The semiconductor body 2, in particular the active region 20, preferably contains a III-V semiconductor material.

III-V semiconductor materials are particularly suitable to generate radiation in the ultraviolet ($In_xGa_yAl_{1-x-y}N$) through the visible ($In_xGa_yAl_{1-x-y}N$, in particular for blue to green radiation, or $In_xGa_yAl_{1-x-y}P$, in particular for yellow to red radiation) to the infrared ($In_xGa_yAl_{1-x-y}As$) spectral range. It holds true in each case here that $0 \leq x \leq 1$, $0 \leq y \leq 1$ and $x+y \leq 1$, in particular where $x \neq 1$, $y \neq 1$, $x \neq 0$ and/or $y \neq 0$. With III-V semiconductor materials, in particular from the material systems mentioned, high internal quantum efficiencies can furthermore be obtained when generating radiation.

The first connection layer 31 and/or the second connection layer 32 preferably in each case contain(s) a metal, for example, titanium, platinum, nickel, gold, silver, aluminum or rhodium, or a metallic alloy comprising at least one of the materials mentioned, or consist(s) of a metal or a metallic alloy. Alternatively or supplementarily, the first connection layer 31 and/or the second connection layer 32 can contain a TCO (transparent conductive oxide) material, for example indium tin oxide (ITO) or zinc oxide, or consist of such a material.

The second connection layer 32 furthermore preferably has a high reflectivity for radiation generated in the active region 20 of the emission region 23. With regard to a high reflectivity, silver, aluminum or rhodium, for example, is suitable in the ultraviolet and blue spectral range, and gold, for example, is suitable in the red and infrared spectral range. By a second connection layer embodied in reflective fashion, radiation generated in the active region and emitted in the direction of the carrier 5 can be deflected in the direction of the radiation exit area 10 and emerge from the semiconductor chip 1 through the radiation exit area.

The first contact 41 and the second contact 42 can contain, in particular, a metal mentioned in association with the first and second connection layers or a metallic alloy comprising one of the materials or can consist of such a material. In particular, materials are suitable which can be used to produce in a simple manner an external electrical contact-connection, for instance by a bonding wire or by a soldering connection. By way of example, gold is particularly suitable as material for the contacts.

In this example, by way of example, a preferably doped semiconductor material, for instance germanium, gallium arsenide or silicon, is suitable as material for the carrier 5.

The first insulation layer 71 can contain, for example, an oxide, for instance silicon oxide or titanium oxide, a nitride, for instance silicon nitride, or an oxynitride, for instance silicon oxynitride, or can consist of such a material.

In a departure from the example described, the semiconductor chip 1 can additionally comprise a protective diode region that protects the semiconductor chip against damage caused by electrostatic discharge (ESD). The integration of a protective diode into the semiconductor body of a semiconductor chip is described in DE 10 2009 006 177 the subject matter of which is hereby incorporated by reference.

Figure 2B:
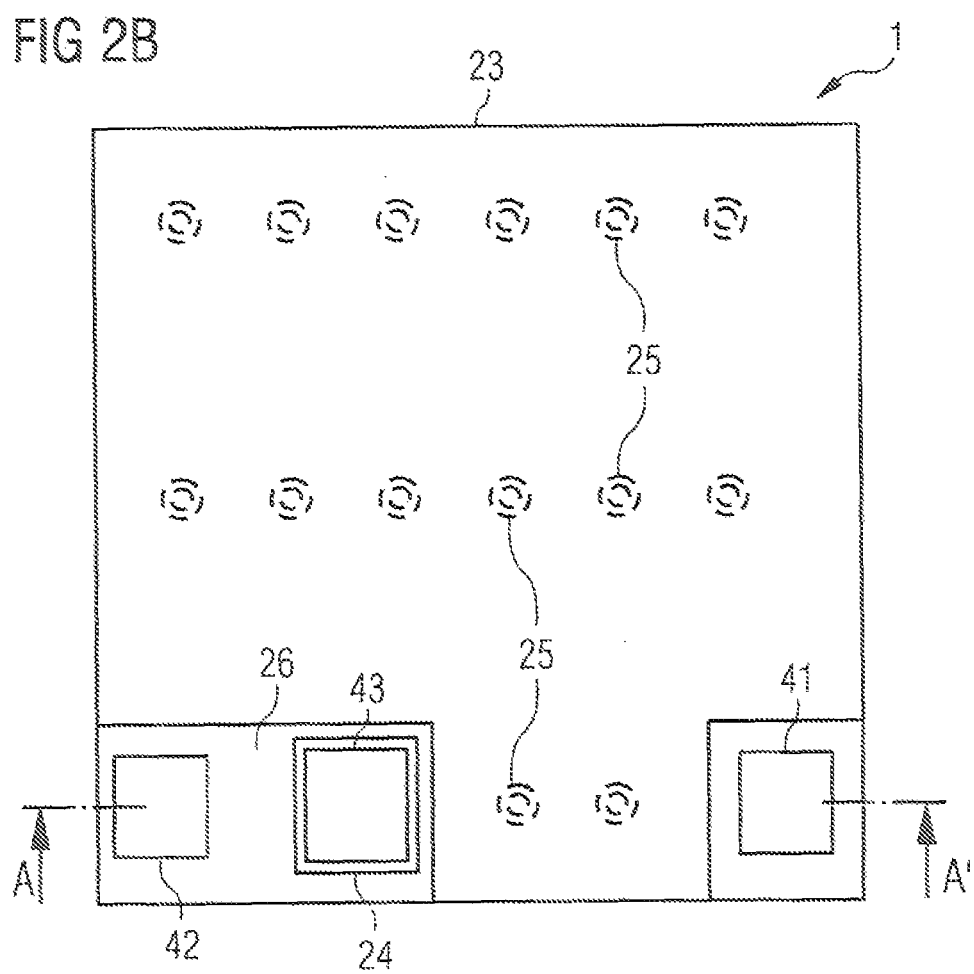

The semiconductor chip in accordance with the second example illustrated in FIGS. 2A and 2B substantially corresponds to the first example described in association with FIGS. 1A and 1B.

In contrast thereto, the first contact 41 and the second contact 42 are arranged on the same side of the carrier 5. In other words, all the contacts of the semiconductor chip 1 are situated on that side of the semiconductor chip facing the radiation exit area 10. In this example, the first contact 41 is arranged in a region in which the semiconductor body 2 and the second connection layer 32 are removed. The first contact 41 directly adjoins the first connection layer 31. Charge carriers are not injected through the carrier, and so electrically insulating materials can also be used for the carrier and for the joining layer 6. By way of example, the carrier can contain a ceramic, for instance aluminum nitride or boron nitride, or can consist of such a material.

In a departure from the example described, however, the first contact and the second contact can also be arranged on the second main area 51 of the carrier 5. In that case, the electrical connection of the contacts 41, 42 to the connection layers 31 and 32, respectively, can be effected, for example, via plated-through holes through the carrier which are electrically insulated from one another.

The arrangement of the contacts 41, 42 and 43 can be varied within wide limits. By way of example, as illustrated in the third example illustrated in FIG. 3 which substantially corresponds to the second example described in association with FIGS. 2A and 2B, the contacts can be arranged alongside one another along a side area of the semiconductor chip 1 such that the emission region 23 has a rectangular basic shape in plan view.

The fourth example illustrated in FIGS. 4A and 4B substantially corresponds to the first example. In contrast thereto, an additional recess 25b is formed in the detection region 24, the additional recess extending through the second semiconductor layer 22 and the active region 20. Through the additional recess, the first semiconductor layer 21 electrically conductively connects to the first connection layer 31 in the detection region 24. The first contact 41 serves as a common contact for the emission region 23 and the detection region 24.

The second connection layer 32 is subdivided by a cutout 27 into a first partial region 32a and a second partial region 32b insulated therefrom. The first partial region serves to make electrical contact with the second semiconductor layer 22 of the emission region 23. The second partial region is provided to make electrical contact with the second semiconductor layer 22 in the detection region 24. In this example, the additional contact 43 is spaced laterally apart from the detection region. The detection region is therefore free of an external contact on the side facing away from the carrier 5.

In this case, to increase the coupling-out of radiation from the emission region 23, the first semiconductor layer 21 can be provided with a roughening (not explicitly illustrated) over the whole area. A complex definition of regions intended to be excluded during the structuring for a subsequent formation of smooth electrical contacts can be dispensed with.

Figure 5A:
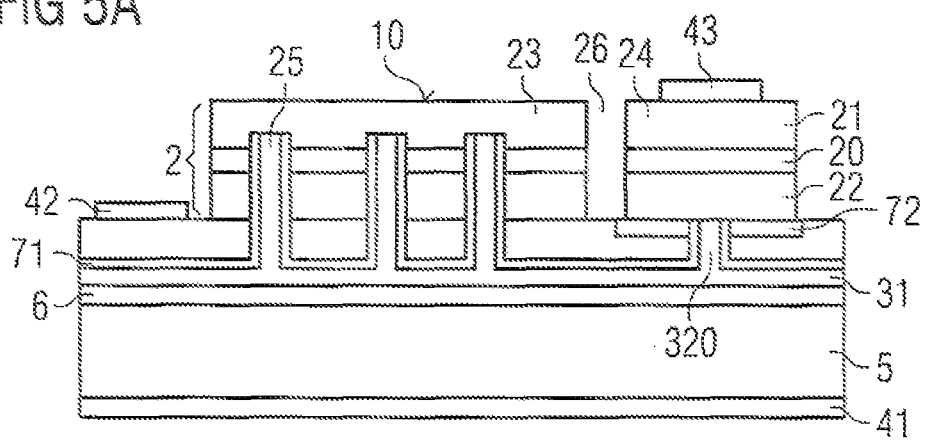
FIGS. 5A and 5B show a fifth example of an optoelectronic semiconductor chip in schematic plan view (FIG. 5B) and associated sectional view (FIG. 5A).
Figure 5B:
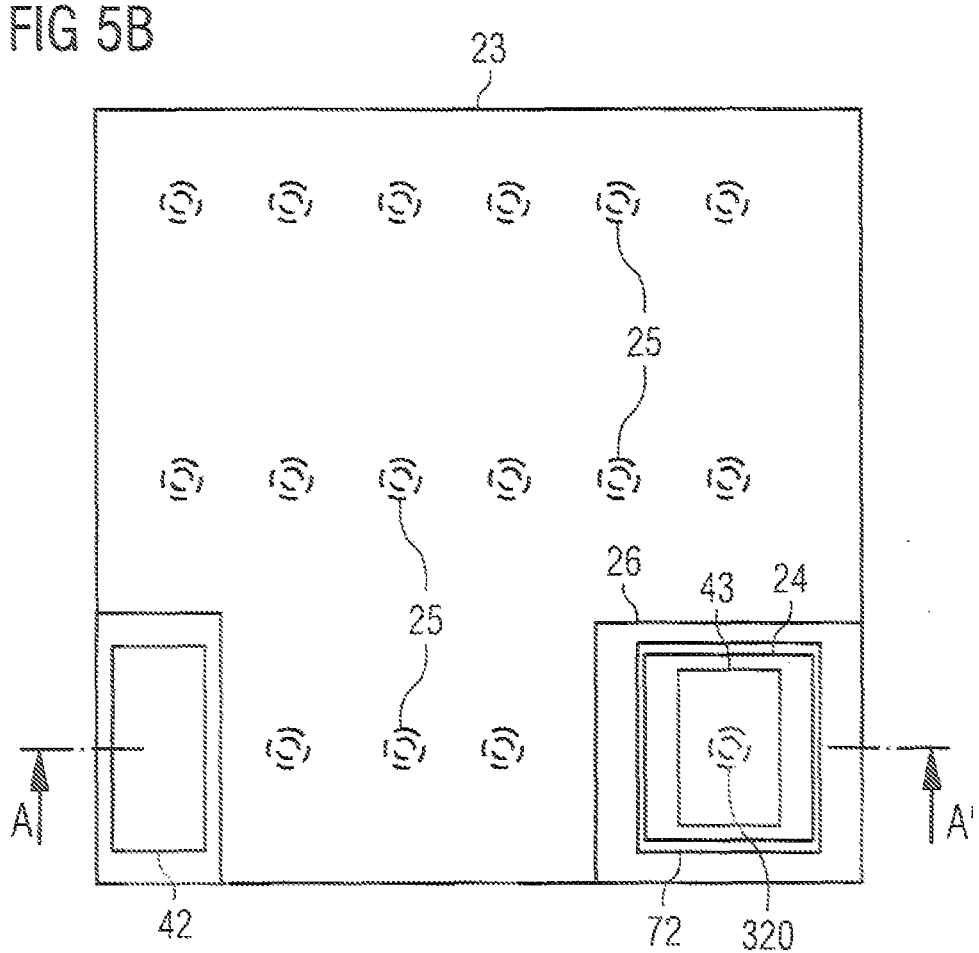

A fifth example of an optoelectronic semiconductor chip is illustrated in FIGS. 5A and 5B. This example substantially corresponds to the first example. In contrast thereto, the first contact 41 is a common contact for the emission region 23 and the detection region 24. The first connection layer 31 electrically conductively connects to the first semiconductor layer 21 in the emission region 23 and to the second semiconductor layer 22 in the detection region 24. The electrical connection to the second semiconductor layer is effected through a detection window 320 formed in the second connection layer 32. To avoid an electrical contact between the second connection layer 32 and the second semiconductor layer in the detection region 24, a second insulation layer 72 is arranged between the second connection layer and the detection region. In a departure from this, however, the electrical insulation can also be obtained by the detection region 24 being arranged completely within the detection window 320 in a plan view of the semiconductor chip 1. The second insulation layer can thus be dispensed with.

An example of a method for producing an optoelectronic semiconductor chip is illustrated on the basis of intermediate steps in FIGS. 6A to 6E, wherein an optoelectronic semiconductor chip embodied as described in the first example is produced by way of example.

Figure 6A:
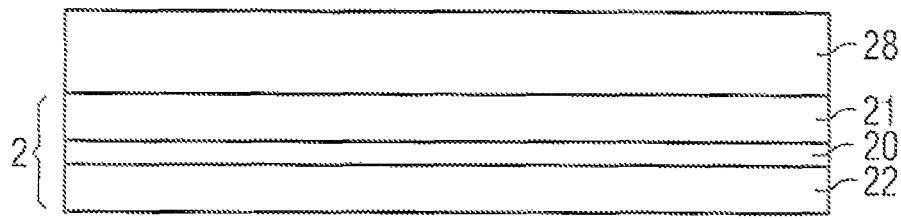
FIGS. 6A to 6E show an example of a method on the basis of intermediate steps illustrated in each case schematically in sectional view.

A semiconductor layer sequence 2 having an active region 20 arranged between a first semiconductor layer 21 and a second semiconductor layer 22 is provided on a substrate, for example, a growth substrate 28 for the semiconductor layer sequence. For simplified illustration, all that is shown is a part of the semiconductor layer sequence from which a semiconductor body for a semiconductor chip emerges during production (FIG. 6A).

Figure 6B:
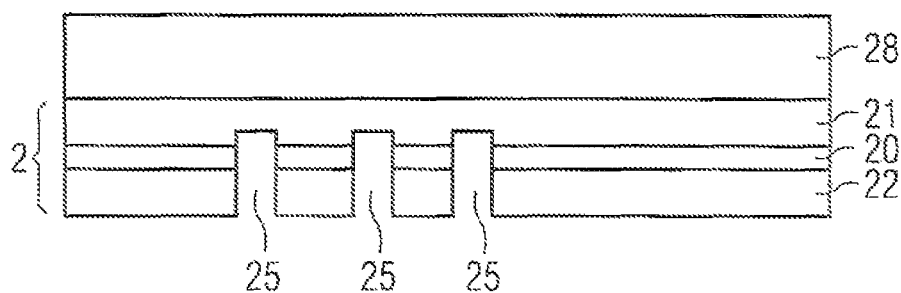
Figure 6C:
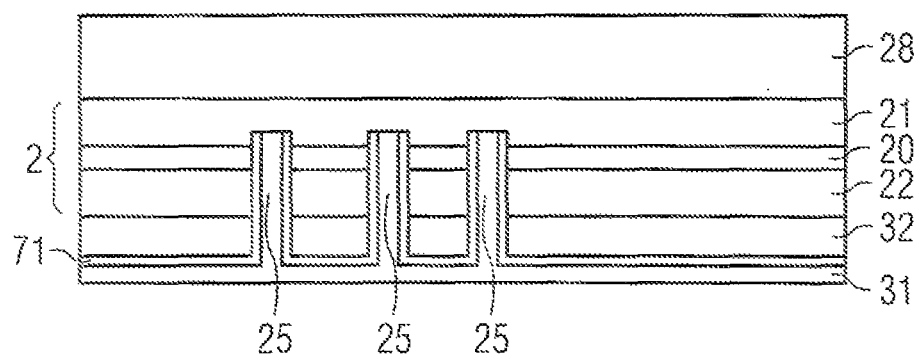
Figure 6D:
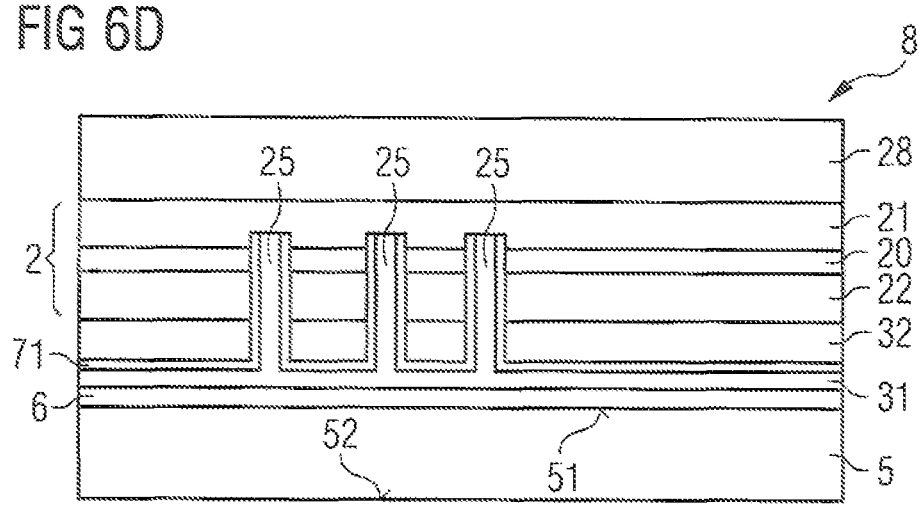
Figure 6E:
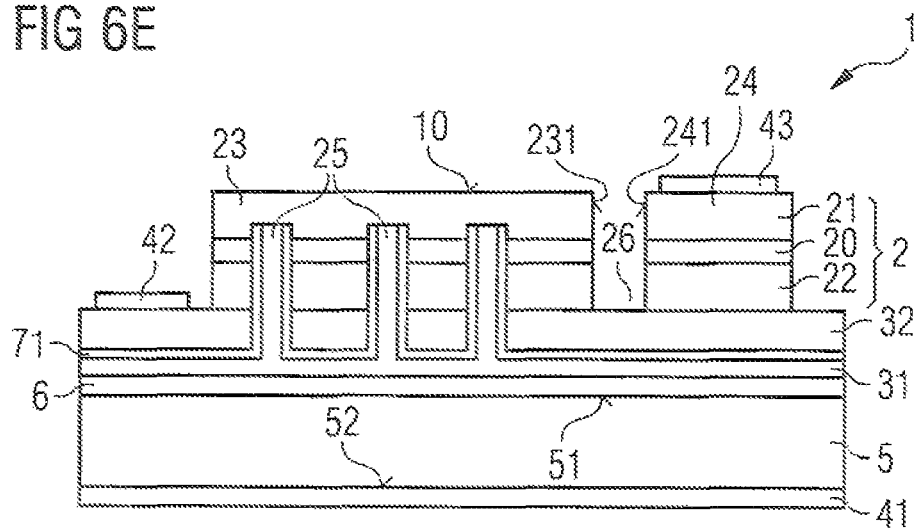

From the side facing away from the growth substrate 28, contacts 25 are formed in the semiconductor layer sequence 2, the recesses extending into the first semiconductor layer 21 (FIG. 6B). A second connection layer 32 is formed on the prefabricated semiconductor layer sequence 2, for example, by vapor deposition or sputtering. An insulation layer is applied, which covers the side areas of the recesses 25. A first connection layer 31 is applied to the insulation layer, the first connection layer producing an electrical connection to the first semiconductor layer in the recess (FIG. 6C).

The first connection layer completely covers the semiconductor layer sequence. Structuring of the first connection layer 31 or structured application of the first connection layer is not necessary.

A composite assembly 8 comprising the semiconductor layer sequence 2 and a carrier 5 is formed by a joining layer 6. The carrier serves to mechanically stabilize the semiconductor layer sequence 2. The growth substrate 28 is no longer necessary for this purpose and can be removed.

Removal can be effected, for example, mechanically, for instance by grinding, lapping or polishing and/or chemically, for instance by means of wet-chemical or dry-chemical etching. Alternatively or supplementarily, a laser detachment method can also be used.

After removal of the growth substrate 28, emission regions 23 and the detection regions 24 can be formed from the semiconductor layer sequence 2.

For the purpose of electrical contact-connection, first contacts 41, second contacts 42 and additional contacts 43 are formed, for instance by vapor deposition or sputtering.

This is followed by singulation into semiconductor chips 1, for example, mechanically, for instance by splitting, breaking, sawing or waterjet cutting, chemically, for instance by wet-chemical or dry-chemical etching, and/or by laser radiation.

Semiconductor chips 1 each having an emission region 23 and a detection region 24 emerge during singulation. The relative arrangements of these regions with respect to one another has already been predefined during production. Complex positioning of a separate photodiode for monitoring the emission characteristic emitted can be dispensed with.

Our chips and methods are not restricted by the description on the basis of the examples. Rather, this disclosure encompasses any novel feature and also any combination of features, which in particular includes any combination of features in the appended claims, even if the feature or combination itself is not explicitly specified in the claims or the examples.

The invention claimed is:

1. An optoelectronic semiconductor chip comprising a carrier and a semiconductor body having a semiconductor layer sequence, said semiconductor body being arranged on the carrier wherein:
   an emission region and a detection region are formed in the semiconductor body having the semiconductor layer sequence;
   the semiconductor layer sequence comprises an active region arranged between a first semiconductor layer and a second semiconductor layer and provided in the emission region to generate radiation;
   the first semiconductor layer is arranged on the side of the active region facing away from the carrier;
   the emission region has a recess extending through the active region;
   the first semiconductor layer electrically conductively connects to a first contact in the emission region via a first connection layer, wherein the first connection layer extends in the recess from the first semiconductor layer in the direction of the carrier, and
   the first connection layer extends through the recess towards the carrier and the first connection layer extends between the second semiconductor layer and the carrier when seen in a vertical direction which runs perpendicular to a main extension plane of the semiconductor layers of the semiconductor body;
   the second semiconductor layer electrically conductively connects to a second contact via a second connection layer; and
   the detection region electrically conductively connects to an additional contact.

2. The semiconductor chip according to claim 1, wherein the semiconductor body cohesively connects to the carrier.

3. The semiconductor chip according to claim 1, wherein the first connection layer runs regionally between the semiconductor body and the carrier.

4. The semiconductor chip according to claim 1, wherein the second connection layer runs regionally between the emission region and the first connection layer.

5. The semiconductor chip according to claim 1, wherein the second contact forms a common contact for the emission and detection regions.

6. The semiconductor chip according to claim 1, wherein the first contact forms a common contact for the emission and detection regions.

7. The semiconductor chip according to claim 6, wherein a connection window is formed in the second connection layer, and the first connection layer connects to the second semiconductor layer through the connection window in the detection region.

8. The semiconductor chip according to claim 1, wherein the additional contact is arranged in the detection region on the first semiconductor layer.

9. The semiconductor chip according to claim 6, wherein the detection region has an additional recess, and the first connection layer extends in the additional recess from the first semiconductor layer in the further recess in a direction of the carrier.

10. The semiconductor chip according to claim 9, wherein the second connection layer is subdivided by a cutout into at least two partial regions electrically insulated from one another.

11. The semiconductor chip according to claim 10, wherein the additional contact and the detection region are arranged alongside one another in a plan view of the semiconductor chip.

12. The semiconductor chip according to claim 1, wherein the active region of the emission region and the active region of the detection region have the same composition.

13. A method of producing a plurality of optoelectric semiconductor chips comprising:
   a) providing a semiconductor layer sequence comprising an active region arranged between a first semiconductor layer and a second semiconductor layer;
   b) forming a plurality of recesses extending through the second semiconductor layer and through the active region;
   c) forming a first connection layer on the semiconductor layer sequence, wherein the first connection layer electrically conductively connects to the first semiconductor layer in the recesses, and the first connection layer covers the second semiconductor layer at least in regions;
   d) forming a composite assembly comprising the semiconductor layer sequence and a carrier;
   e) forming a plurality of emission regions and a plurality of detection regions from the semiconductor layer sequence, wherein the emission regions each have at least one recess and the detection regions are each provided with an additional contact electrically insulated from the emission regions; and
   f) singulating the composite assembly into a plurality of semiconductor chips, wherein each semiconductor chip comprises at least one emission region and at least one detection region.

14. The method according to claim 13, wherein, before step e), a growth substrate for the semiconductor layer sequence is removed at least regionally.

15. The method according to claim 13, wherein a plurality of semiconductor chips comprising a carrier and a semiconductor body having a semiconductor layer sequence, said semiconductor body being arranged on the carrier wherein:
   an emission region and a detection region are formed in the semiconductor body having the semiconductor layer sequence;
   the semiconductor layer sequence comprises an active region arranged between a first semiconductor layer and a second semiconductor layer and provided in the emission region to generate radiation;
   the first semiconductor layer is arranged on the side of the active region facing away from the carrier;
   the emission region has a recess extending through the active region;
   the first semiconductor layer electrically conductively connects to a first contact in the emission region via a first connection layer wherein the first connection layer extends in the recess from the first semiconductor layer in the direction of the carrier;
   the second semiconductor layer electrically conductively connects to a second contact via a second connection layer; and
   the detection region electrically conductively connects to an additional contact, are produced.

16. The semiconductor chip according to claim 1, wherein the semiconductor body has a plurality of recesses extending through the second semiconductor layer and through the active region into the first semiconductor layer, and the first connection layer runs through the recesses and produces an electrical connection to the first semiconductor layer.

17. The semiconductor chip according to claim 1, wherein an area of the detection region in plan view of the semiconductor chip is smaller than an area of the emission region.

18. The semiconductor chip according to claim 1, wherein the first connection layer completely or at least substantially completely covers the carrier.

19. The method according to claim 13, wherein step e) is performed after step d).

* * * * *